(12) United States Patent
Imura

(10) Patent No.: US 7,746,149 B2
(45) Date of Patent: Jun. 29, 2010

(54) VOLTAGE LEVEL SHIFT CIRCUIT AND SEMICONDUCTOR INTEGRATED CIRCUIT

(75) Inventor: Takashi Imura, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 12/484,664

(22) Filed: Jun. 15, 2009

(65) Prior Publication Data
US 2009/0289686 A1    Nov. 26, 2009

Related U.S. Application Data

(62) Division of application No. 11/699,130, filed on Jan. 26, 2007, now Pat. No. 7,564,289.

(30) Foreign Application Priority Data

Jan. 31, 2006    (JP)    .............................. 2006-021764

(51) Int. Cl.
*H03L 5/00* (2006.01)
(52) U.S. Cl. .................................................... 327/333
(58) Field of Classification Search ................. 327/318, 327/319, 333, 561, 562, 563
See application file for complete search history.

(56) References Cited

U.S. PATENT DOCUMENTS

| | | | |
|---|---|---|---|
| 6,177,824 B1 * | 1/2001 | Amanai | ....................... 327/333 |
| 6,617,878 B2 * | 9/2003 | Brownlow et al. | ............. 326/68 |
| 7,271,639 B2 * | 9/2007 | Satou et al. | .................. 327/333 |
| 7,358,790 B2 * | 4/2008 | Kuo | ........................... 327/333 |
| 2003/0174014 A1 | 9/2003 | Nakashimo et al. | |

FOREIGN PATENT DOCUMENTS

JP    H05-022054    1/1993

OTHER PUBLICATIONS

Behzad Razavi, "Design of Analog CMOS Integrated Circuits", Maruzen Co., Ltd., Mar. 30, 2003, pp. 67-69.

* cited by examiner

*Primary Examiner*—Jeffrey S Zweizig
(74) *Attorney, Agent, or Firm*—Brinks Hofer Gilson & Lione

(57)    ABSTRACT

Provided is a voltage level shift circuit including: a first voltage level shift circuit formed of a P-channel enhancement type transistor (M1) and an N-channel depletion type MOS transistor (M3); and a second voltage level shift circuit formed of a P-channel enhancement type transistor (M2) and an N-channel depletion type MOS transistor (M4). In the voltage level shift circuit, a cascode circuit using an N-channel depletion type transistor (M5) is serially connected to the first voltage level shift circuit, a cascode circuit using an N-channel depletion type transistor (M6) is serially connected to the second voltage level shift circuit, and a unit for complementarily controlling bias voltages of the respective cascode circuits. As a result, an output signal of the voltage level shift circuit connected to an input of a differential amplifier circuit, for expanding an input voltage range of a signal, is not affected by fluctuations in power supply voltage.

2 Claims, 6 Drawing Sheets

VOLTAGE LEVEL SHIFT CIRCUIT AND SEMICONDUCTOR INTEGRATED CIRCUIT

This application is a Division of U.S. patent application Ser. No. 11/699,130 filed on Jan. 26, 2007, now U.S. Pat. No. 7,564,289, which claims priority to Japanese Patent Application No. JP2006-021764 filed on Jan. 31, 2006, the entire contents of which are herein incorporated by reference.

BACKGROUND OF THE INVENTION

1. Field of the Invention

The present invention relates to a voltage level shift circuit and a semiconductor integrated circuit including a differential amplifier circuit which uses the voltage level shift circuit. More particularly, the present invention relates to a voltage level shift circuit with improved relative accuracy and improved power supply rejection ratio and to a semiconductor integrated circuit using the voltage level shift circuit.

2. Description of the Related Art

A technique to add a voltage level shift circuit to an input stage of a differential amplifier circuit or the like to expand an input voltage range of the differential amplifier circuit is conventionally widely used (see, for example, JP 05-22054 A).

Such a voltage level shift circuit is, for example, in a constant voltage circuit illustrated in FIG. 6A, inserted on an input side of an error amplifier (differential amplifier circuit) 101 to be used as a voltage level shift circuit 100 for expanding an input voltage range of the error amplifier (differential amplifier circuit) 101 in some cases. In such a constant voltage circuit, when a low voltage (for example, 315 mV) is outputted as an output DCout, in order to decrease the number of divided resistors R1 and R2 connected to a power MOS transistor 31 for power output, it is preferable to monitor as a low voltage as possible by a voltage feedback signal VFB and to set a reference voltage Vref outputted from a reference voltage circuit 30 to 315 mV.

However, as the error amplifier 101, a differential amplifier circuit using MOS transistors as illustrated in FIG. 6B is often used. In the differential amplifier circuit (error amplifier) 101, a drain-source voltage (Vds) of an N-channel enhancement type MOS transistor M11 is about 200 mV, while a gate-source voltage (Ggs) of an N-channel enhancement type MOS transistor M9 is about 400 mV, and thus, an input signal of 600 mV or more is necessary at input terminals IN+ and IN− of the differential amplifier circuit. Therefore, it is necessary to shift the level of the direct current potential of a reference voltage Vref (signal of about 315 mV) and a voltage feedback signal VFB by the voltage level shift circuit 100 to be inputted to the differential amplifier circuit (error amplifier) 101 as a signal of 600 mV or more.

In this way, when the level of the direct current potential of an input signal is shifted in a positive direction by a voltage level shift circuit, a source follower circuit using a P-channel enhancement type MOS transistor with a constant current circuit being a load is sometimes used. For example, FIG. 7 illustrates an exemplary conventional source follower circuit (see Behzad Razavi, "Design of Analog CMOS Integrated Circuits", Maruzen Co., Ltd., Mar. 30, 2003, pp. 82-91).

The conventional source follower circuit uses a constant current source formed of a bias voltage source 14 for outputting a constant voltage with a power supply voltage being the reference and a P-channel enhancement type MOS transistor M32 as a load of a P-channel enhancement type transistor M31. Here, the relationship between a direct current potential Vi of the input voltage and a direct current potential Vo of the output voltage is:

$$Vo = Vi + VTP + (1/K)^{1/2},\quad (1)$$

where a current supplied by the constant current source is I. Here, VTP and K are a threshold voltage and a conductance coefficient, respectively, of the P-channel enhancement type transistor M31 which operates as a source follower.

It is to be noted that there are conventional reference voltage circuits and an electronic device (see JP 2003-295957 A). However, an object of the conventional reference voltage circuits is to decrease the difference in voltage applied to the reference voltage circuits and to make smaller the difference between the output voltages of the respective reference voltage circuits. The conventional reference voltage circuits are not related to the above-mentioned voltage level shift circuit (source follower circuit).

When the voltage level shift circuit illustrated in FIG. 7 is used at the input of a differential amplifier circuit, at least two voltage level shift circuits having the same characteristics are necessary. However, when a plurality of voltage level shift circuits having the same characteristics are formed, there is a problem in that, due to uneven accuracy in manufacture, it is difficult to maintain the same difference between the input potential and the output potential of the respective voltage level shift circuits.

Further, in a voltage level shift circuit illustrated in FIG. 7, due to fluctuations in the power supply voltage, source-drain voltage of a transistor M32 for supplying constant current fluctuates, and thus, there is a problem in that the power supply rejection ratio is deteriorated due to channel length modulation effect.

Further, the voltage level shift circuit illustrated in FIG. 7 has a problem in that, because fluctuations on the side of the power supply voltage are caused at an output terminal through a parasitic capacitance between a substrate and a drain terminal of the P-channel enhancement type transistor M32 used as the load, the power supply rejection ratio at a low frequency (<1 kHz) is deteriorated.

SUMMARY OF THE INVENTION

The present invention has been made to solve the above-mentioned problems, and it is an object of the present invention to provide a voltage level shift circuit which can, when a plurality of voltage level shift circuits are necessary, maintain the same difference between the input potential and the output potential of the respective voltage level shift circuits and improve a power supply rejection ratio, and a semiconductor integrated circuit using the voltage level shift circuit.

According to an aspect of the present invention, there is provided a voltage level shift circuit including: at least two source follower circuits for shifting a level of a direct current voltage of an input signal and outputting the direct current voltage of the input signal; cascode circuits each connected between each of the source follower circuits and a power supply, for applying a bias voltage of a power supply voltage to the source follower circuits; means for controlling the bias voltage of each of the cascode circuits by a bias voltage signal from a source follower circuit which is unconnected to the cascode circuit in series; and means for outputting the signal the level of which is shifted by the source follower circuits as an input signal of a differential amplifier circuit.

With this structure, the voltage level shift circuit is formed of the source follower circuits and a cascode circuit is added to each of the source follower circuits. The bias voltage of each of the cascode circuits is controlled by a bias voltage signal from the source follower circuit which is not serially connected to the cascode circuit.

As a result, when the voltage level shift circuits are used at the input of the differential amplifier circuit, the same difference between the input potential and the output potential of the respective voltage level shift circuits can be maintained with accuracy, and the power supply rejection ratio of the source follower circuits can be improved.

Further, in the voltage level shift circuit of the present invention, each of the source follower circuits includes: a P-channel enhancement type MOS transistor; and an N-channel depletion type MOS transistor serially connected to the P-channel enhancement type MOS transistor to be a constant current load of the P-channel enhancement type MOS transistor; and each of the source follower circuits is formed on a P-type substrate.

With this structure, the P-channel enhancement type MOS transistor and the N-channel depletion type MOS transistor (constant current load) are formed on the P-type substrate to form the source follower circuit.

As a result, the source follower circuit using the P-channel enhancement type MOS transistor and the N-channel depletion type MOS transistor can be formed with ease on the P-type substrate.

Further, in the voltage level shift circuit of the present invention, each of the cascode circuits is formed of at least one N-channel depletion type MOS transistor.

With this structure, the cascode circuit can be formed with ease using the N-channel depletion type MOS transistor.

Further, the voltage level shift circuit of the present invention further includes: a first source follower circuit including a first voltage signal input terminal (In1), a first voltage signal output terminal (Out1), and a first bias voltage output terminal (B1); a second source follower circuit including a second voltage signal input terminal (In2), a second voltage signal output terminal (Out2), and a second bias voltage output terminal (B2); a first cascode circuit serially connected to the first source follower circuit; a second cascode circuit serially connected to the second source follower circuit; means for controlling a bias voltage of the second cascode circuit based on a voltage outputted from the first bias voltage output terminal (B1); and means for controlling a bias voltage of the first cascode circuit based on a voltage outputted from the second bias voltage output terminal (B2).

With this structure, the bias voltage of the first cascode circuit connected to the first source follower circuit is controlled based on the bias voltage of the second cascode circuit connected to the second source follower circuit. Further, the bias voltage of the second cascode circuit connected to the second source follower circuit is controlled based on the bias voltage of the first cascode circuit connected to the first source follower circuit. In other words, the bias voltage of the first cascode circuit and the bias voltage of the second cascode circuit are complementarily controlled so as to be equal to each other.

As a result, when the voltage level shift circuits are used at the input of the differential amplifier circuit, the same difference between the input potential and the output potential of the respective voltage level shift circuits can be maintained with accuracy, and the power supply rejection ratio of the source follower circuits can be improved.

Further, the voltage level shift circuit of the present invention further includes: a first source follower circuit including: a first P-channel enhancement type MOS transistor (M1), a gate terminal of which is connected to a first voltage signal input terminal (In1) and a drain terminal of which is grounded; and a first N-channel depletion type MOS transistor (M3), a source terminal and a gate terminal of which are connected to a source terminal of the first P-channel enhancement type MOS transistor (M1) and to a first voltage signal output terminal (Out1) and a drain terminal of which is connected to the first bias voltage output terminal (B1); a second source follower circuit including: a second P-channel enhancement type MOS transistor (M2), a gate terminal of which is connected to a second voltage signal input terminal (In2) and a drain terminal of which is grounded; and a second N-channel depletion type MOS transistor (M4), a source terminal and a gate terminal of which is connected to a source terminal of the second P-channel enhancement type MOS transistor (M2) and to a second voltage signal output terminal (Out2) and a drain terminal of which is connected to the second bias voltage output terminal (B2); a first cascode circuit formed of a third N-channel depletion type MOS transistor (M5), a gate terminal of which is connected to the second bias voltage output terminal (B2), a source terminal of which is connected to the drain terminal of the first N-channel depletion type MOS transistor (M3), and a drain terminal of which is fixed to the power supply voltage; and a second cascode circuit formed of a fourth N-channel depletion type MOS transistor (M6), a gate terminal of which is connected to the first bias voltage output terminal (B1), a source terminal of which is connected to the drain terminal of the second N-channel depletion type MOS transistor (M4), and a drain terminal of which is fixed to the power supply voltage.

With this structure, the gate terminal of the first cascode circuit (M5) serially connected to the first source follower circuit is connected to the bias voltage output terminal (B2) of the second source follower circuit. Further, the gate terminal of the second cascode circuit (M6) serially connected to the second source follower circuit is connected to the bias voltage output terminal (B1) of the first source follower circuit. In this way, the bias voltage of the first cascode circuit and the bias voltage of the second cascode circuit are complementarily controlled so as to be equal to each other.

As a result, when the voltage level shift circuits are used at the input of the differential amplifier circuit, the same difference between the input potential and the output potential of the respective voltage level shift circuits can be maintained with accuracy, and the power supply rejection ratio of the source follower circuits can be improved.

Further, the voltage level shift circuit of the present invention includes: a first source follower circuit including: a first P-channel enhancement type MOS transistor (M1), a gate terminal of which is connected to a first voltage signal input terminal (In1) and a drain terminal of which is grounded; and a first N-channel depletion type MOS transistor (M3), a source terminal and a gate terminal of which are connected to a source terminal of the first P-channel enhancement type MOS transistor (M1), to a first voltage signal output terminal (Out1), and to the first bias voltage output terminal (B1); a second source follower circuit including: a second P-channel enhancement type MOS transistor (M2), a gate terminal of which is connected to a second voltage signal input terminal (In2) and a drain terminal of which is grounded; and a second N-channel depletion type MOS transistor (M4), a source terminal and a gate terminal of which is connected to a source terminal of the second P-channel enhancement type MOS transistor (M2), to a second voltage signal output terminal (Out2), and to the second bias voltage output terminal (B2); a first cascode circuit formed of a third N-channel depletion type MOS transistor (M5), a gate terminal of which is connected to the second bias voltage output terminal (B2), a source terminal of which is connected to the drain terminal of the first N-channel depletion type MOS transistor (M3), and a drain terminal of which is fixed to the power supply voltage; and a second cascode circuit formed of a fourth N-channel depletion type MOS transistor (M6), a gate terminal of which is connected to the first bias voltage output terminal (B1), a source terminal of which is connected to the drain terminal of the second N-channel depletion type MOS transistor (M4), and a drain terminal of which is fixed to the power supply voltage.

With this structure, the gate terminal of the first cascode circuit (M5) serially connected to the first source follower circuit is connected to the second bias voltage output terminal (B2) of the second source follower circuit. Further, the gate terminal of the second cascode circuit (M6) serially connected to the second source follower circuit is connected to the first bias voltage output terminal (B1) of the first source follower circuit. In this way, the bias voltage of the first cascode circuit and the bias voltage of the second cascode circuit are complementarily controlled so as to be equal to each other.

As a result, when the voltage level shift circuits are used at the input of the differential amplifier circuit, the same difference between the input potential and the output potential of the respective voltage level shift circuits can be maintained with accuracy, and the power supply rejection ratio of the source follower circuits can be improved.

Further, according to another aspect of the present invention, there is provided a voltage level shift circuit including: a first source follower circuit including: a first P-channel enhancement type MOS transistor (M21), a gate terminal of which is connected to a first voltage signal input terminal (In11) and a drain terminal of which is grounded; and a second P-channel enhancement type MOS transistor (M22), a drain terminal of which is connected to a source terminal of the first P-channel enhancement type MOS transistor (M21) and to a first voltage signal output terminal (Out11) to be a constant current load; a second source follower circuit including: a third P-channel enhancement type MOS transistor (M23), a gate terminal of which is connected to a second voltage signal input terminal (In12) and a drain terminal of which is grounded; and a fourth P-channel enhancement type MOS transistor (M24), a drain terminal of which is connected to a source terminal of the third P-channel enhancement type MOS transistor (M23) and to a second voltage signal output terminal (Out12) to be a constant current load; a cascode circuit formed of an N-channel depletion type MOS transistor (M26), a gate terminal of which is connected to a fixed potential, a source terminal of which is connected to a source terminal of the second P-channel enhancement type MOS transistor (M22) and to a source terminal of the fourth P-channel enhancement type MOS transistor (M24), and a drain terminal of which is fixed to power supply voltage; and a fifth P-channel enhancement type MOS transistor (M25) which, together with the second P-channel enhancement type MOS transistor (M22) and the fourth P-channel enhancement type MOS transistor (M24), forms a current mirror circuit, for causing a current which is the same as a reference current (Iref) to flow through the second P-channel enhancement type MOS transistor (M22) and the fourth P-channel enhancement type MOS transistor (M24).

With this structure, one common cascode circuit is added to the first source follower circuit and the second source follower circuit. Further, the same constant current is caused to flow through the transistors as the constant current loads of the first source follower circuit and the second source follower circuit, respectively, by a current mirror circuit.

As a result, when the voltage level shift circuits are used at the input of the differential amplifier circuit, the same difference between the input potential and the output potential of the respective voltage level shift circuits can be maintained with accuracy, and the power supply rejection ratio of the source follower circuits can be improved.

Further, according to another aspect of the present invention, there is provided a semiconductor integrated circuit including the voltage level shift circuit described above.

As a result, when the voltage level shift circuits are used at the input of the differential amplifier circuit of the semiconductor integrated circuit, the same difference between the input potential and the output potential of the respective voltage level shift circuits can be maintained with accuracy, and the power supply rejection ratio can be improved.

According to the present invention, when a plurality of voltage level shift circuits (source follower circuits) are necessary, the same difference between the input potential and the output potential of the respective voltage level shift circuits can be maintained with accuracy, and the power supply rejection ratio can be improved.

DETAILED DESCRIPTION OF THE PREFERRED EMBODIMENTS

Best modes for carrying out the present invention is now described in the following with reference to the attached drawings.

First Embodiment

Figure 1:
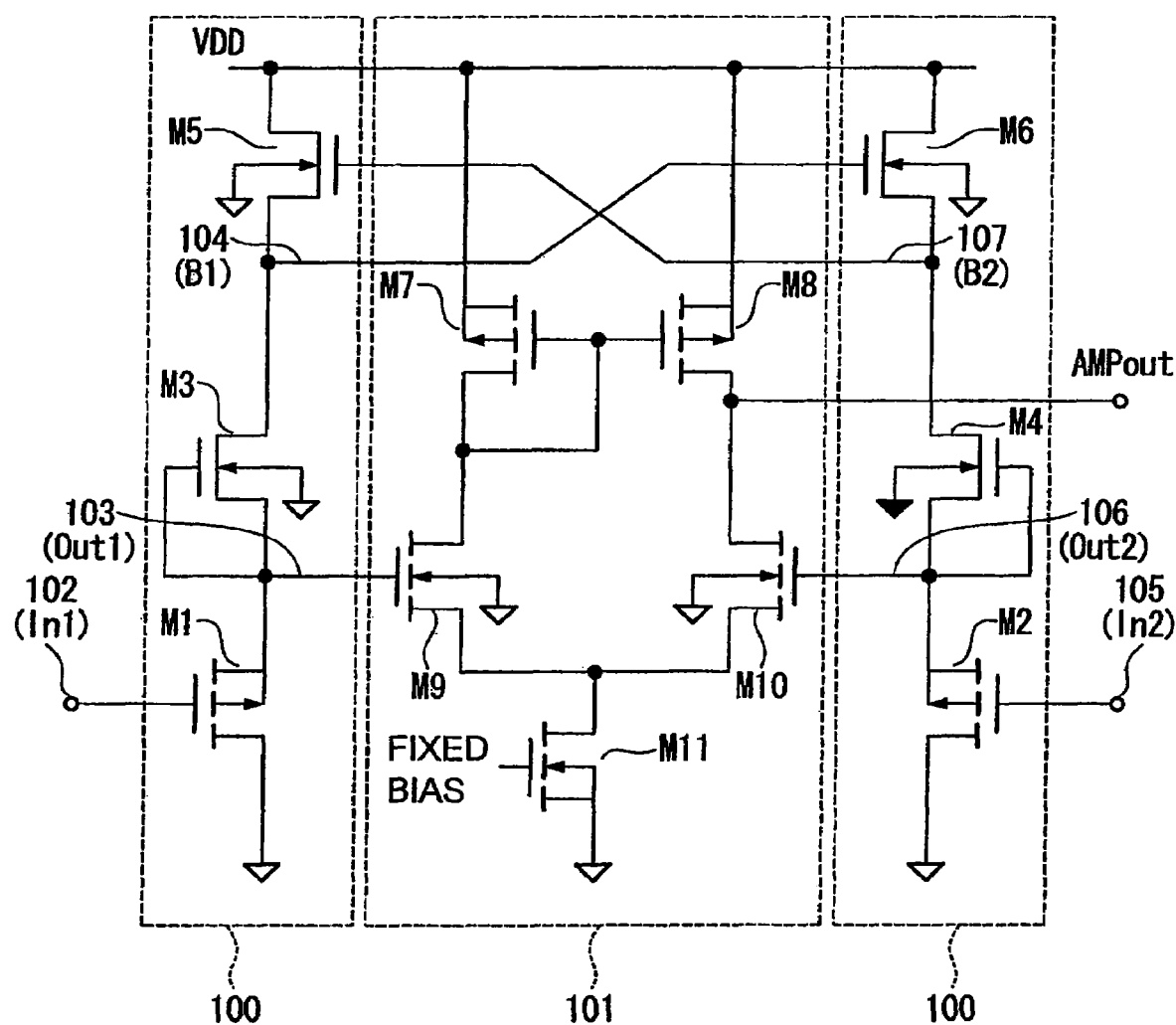
FIG. 1 illustrates a voltage level shift circuit according to a first embodiment of the present invention.

FIG. 1 illustrates a voltage level shift circuit according to a first embodiment of the present invention. In FIG. 1, portions surrounded by broken lines 100 operate as voltage level shift circuits, while a portion surrounded by a broken line 101 operates as a differential amplifier circuit. Further, the circuits illustrated in FIG. 1 are formed on a P-type substrate.

A transistor M1 is a P-channel enhancement type MOS transistor, and a first signal input terminal (In1) 102 is connected to its gate. A transistor M3 is an N-channel depletion type MOS transistor, and operates as a constant current source because its gate and its source are connected to each other. In this way, the circuit formed of the transistor M1 and the transistor M3 operates as a source follower circuit with the transistor M3 (constant current source) being a load, and the circuit functions to shift a direct current component of the input voltage of the first signal input terminal (In1) 102 to a positive power supply voltage side and to output the shifted direct current component.

Therefore, the source follower circuit formed of the transistor M1 and the transistor M3 operates as a first voltage level shift circuit for shifting the direct current component of a signal inputted from the signal input terminal (In1) 102 to the positive voltage direction and for outputting the shifted direct current component to a signal output terminal (Out1) 103.

A transistor M2 is a P-channel enhancement type MOS transistor, and a second signal input terminal (In2) 105 is connected to its gate. A transistor M4 is an N-channel depletion type MOS transistor, and operates as a constant current source because its gate and its source are connected to each other. In this way, the circuit formed of the transistor M2 and the transistor M4 operates as a source follower circuit with the transistor M4 (constant current source) being a load, and the circuit functions to shift a direct current component of the input voltage of the second signal input terminal (In2) 105 to a positive power supply voltage side and to output the shifted direct current component.

Therefore, the source follower circuit formed of the transistor M2 and the transistor M4 operates as a second voltage level shift circuit for shifting the direct current component of a signal inputted from the second signal input terminal (In2) 105 to the positive voltage direction and for outputting the shifted direct current component to a signal output terminal (Out2) 106.

A transistor M5 is an N-channel depletion type MOS transistor, and is serially connected to the first voltage level shift circuit. A gate terminal of the transistor M5 is connected to a drain terminal of the transistor M4 which is a bias voltage output terminal (B2) 107 of the second voltage level shift circuit.

A transistor M6 is serially connected to the second voltage level shift circuit. A gate terminal of the transistor M6 is connected to a drain terminal of the transistor M3 which is a bias voltage output terminal (B1) 104 of the first voltage level shift circuit.

In this way, the gate terminal of the transistor M5 is biased by a constant voltage which is the terminal voltage of the bias output terminal (B2) 107 of the second voltage level shift circuit, and the drain current is determined by the transistor M3 which operates as a constant current source, and thus, even if a power supply voltage VDD fluctuates, the source terminal voltage of the transistor M5 almost does not change. Therefore, the transistor M5 operates as a cascode circuit of the serially connected first voltage level shift circuit.

Similarly, the gate terminal of the transistor M6 is biased by a constant voltage which is the terminal voltage of the bias output terminal (B1) 104 of the first voltage level shift circuit, and the drain current is determined by the transistor M4 which operates as a constant current source, and thus, even if the power supply voltage VDD fluctuates, the source terminal voltage of the transistor M6 almost does not change. Therefore, the transistor M6 operates as a cascode circuit of the serially connected second voltage level shift circuit.

Figure 3:
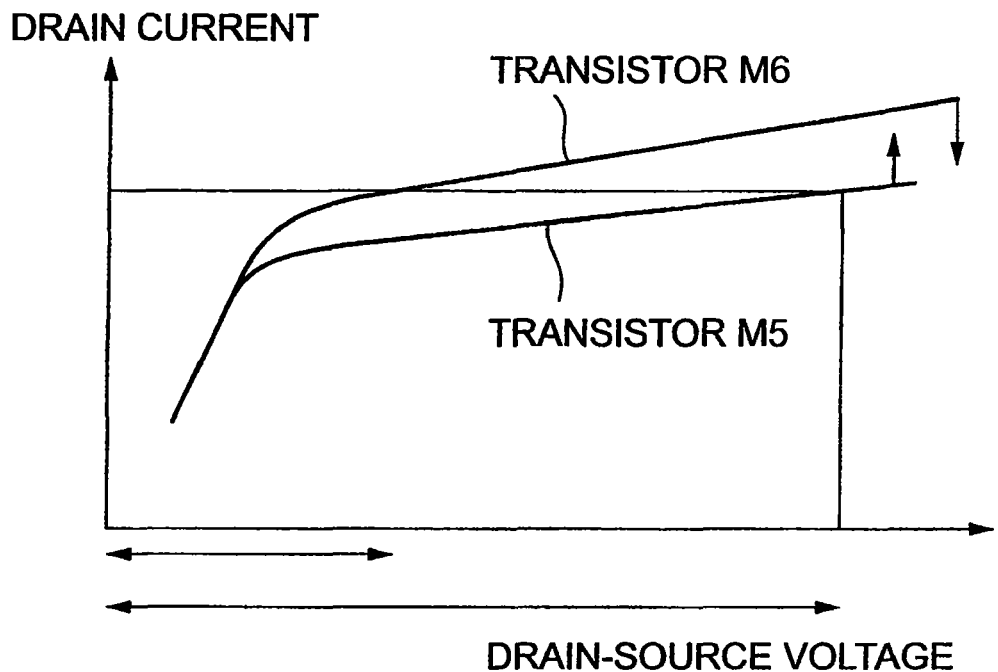
FIG. 3 illustrates a relationship between a drain-source voltage and a drain current of transistors M5 and M6.

Operation of the transistor M5 and the transistor M6 is now described with reference to FIG. 3. FIG. 3 illustrates the relationship between the drain-source voltage and the drain current of the depletion type MOS transistors M5 and M6. When the size of the depletion type MOS transistors M5 and M6 are appropriately set, the drain currents through the depletion type MOS transistors M5 and M6 are determined by the voltage level shift circuits.

Here, it is supposed that the relationship between the drain-source voltage and the drain current differs between the depletion type MOS transistors M5 and M6 due to mask misalignment or the like.

At this time, the drain-source voltage of the depletion type MOS transistor M5 differs from the drain-source voltage of the depletion type MOS transistor M6. However, the gate voltage of the depletion type MOS transistor M5 is obtained by subtracting the drain-source voltage (bias voltage) of the depletion type MOS transistor M6 from the voltage at the voltage supply terminal VDD. The gate voltage of the depletion type MOS transistor M6 is obtained by subtracting the drain-source voltage (bias voltage) of the depletion type MOS transistor M5 from the voltage at the voltage supply terminal VDD.

Therefore, the gate voltage of the depletion type MOS transistor M5 the drain-source voltage of which is higher is the difference between the drain-source voltage of the depletion type MOS transistor M6 the drain-source voltage of which is lower and the voltage at the voltage supply terminal VDD, so the gate voltage rises and the relationship between the drain-source voltage and the drain current changes as indicated by an arrow in the figure. With regard to the depletion type MOS transistor M6, because the gate voltage of the depletion type MOS transistor M6 the drain-source voltage of which is lower is the difference between the drain-source voltage of the depletion type MOS transistor M5 the drain-source voltage of which is higher and the voltage at the voltage supply terminal VDD, the gate voltage drops and the relationship between the drain-source voltage and the drain current changes as indicated by an arrow in the figure.

Figure 4:
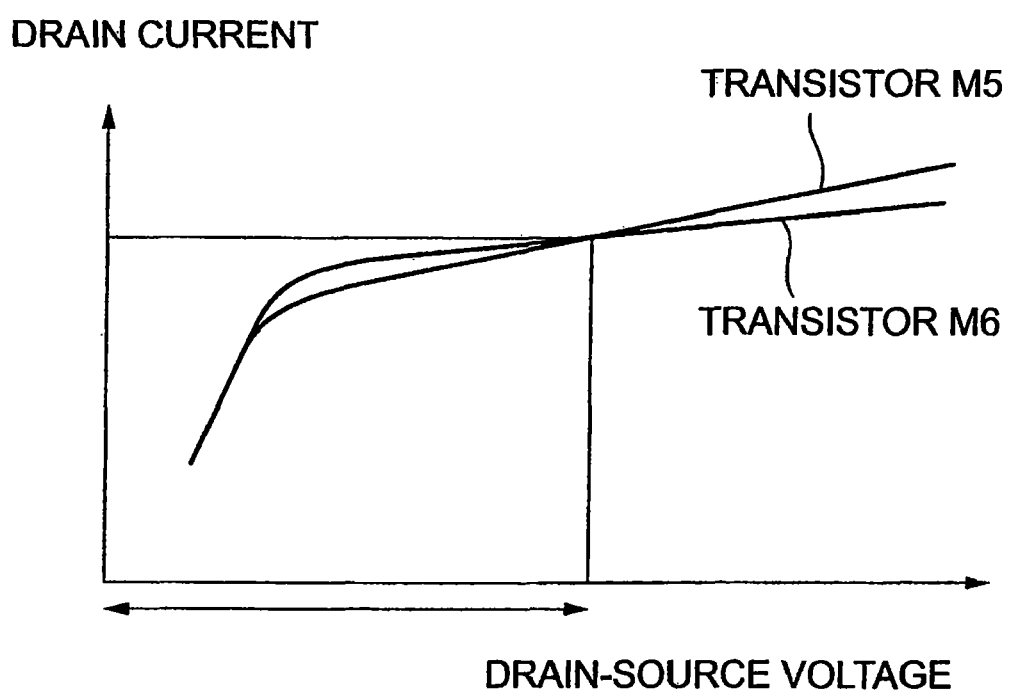
FIG. 4 illustrates the relationship between the drain-source voltage and the drain current of the transistors M5 and M6 according to the present invention.

FIG. 4 illustrates the relationship between the drain-source voltage and the drain current of the depletion type transistors M5 and M6. As illustrated in the figure, the relationship between the drain-source voltage and the drain current changes such that the drain-source voltages are at the same potential, the voltages supplied to the voltage level shift circuits are at the same potential, and thus, the voltages outputted to the voltage level shift circuits are the same.

It is to be noted that, when there are three voltage level shift circuits, a gate terminal of a depletion type MOS transistor of a first voltage level shift circuit may be connected to a source terminal of a depletion type MOS transistor of a second voltage level shift circuit, a gate terminal of the depletion type MOS transistor of the second voltage level shift circuit may be connected to a source terminal of a depletion type MOS transistor of a third voltage level shift circuit, and a gate terminal of the depletion type MOS transistor of the third voltage level shift circuit may be connected to a source terminal of the depletion type MOS transistor of the first voltage level shift circuit. This can also decrease the difference in the voltages applied to the respective voltage level shift circuits and can make smaller the difference in the respective output voltages. Similarly, this can be applied to cases where there are a plurality of voltage level shift circuits.

As described in the above, by the action of the cascode circuits formed of the transistor M5 and the transistor M6, respectively, the influence of fluctuations in the power supply voltage on the drain-source potentials of the transistor M3 and the transistor M4 which operate as the constant current sources can be made smaller, and the change in the drain current due to channel length modulation effect of the transistors M3 and M4 can be made smaller.

Further, because the transistor M5 and the transistor M6 which operate as the cascode circuits are formed of N-channel depletion type MOS transistors, impedance of a small signal between the source terminal and the drain terminal due to parasitic capacitance can be made higher, and the power supply rejection ratio at a low frequency (<1 kHz) can be made higher.

Second Embodiment

Figure 2:
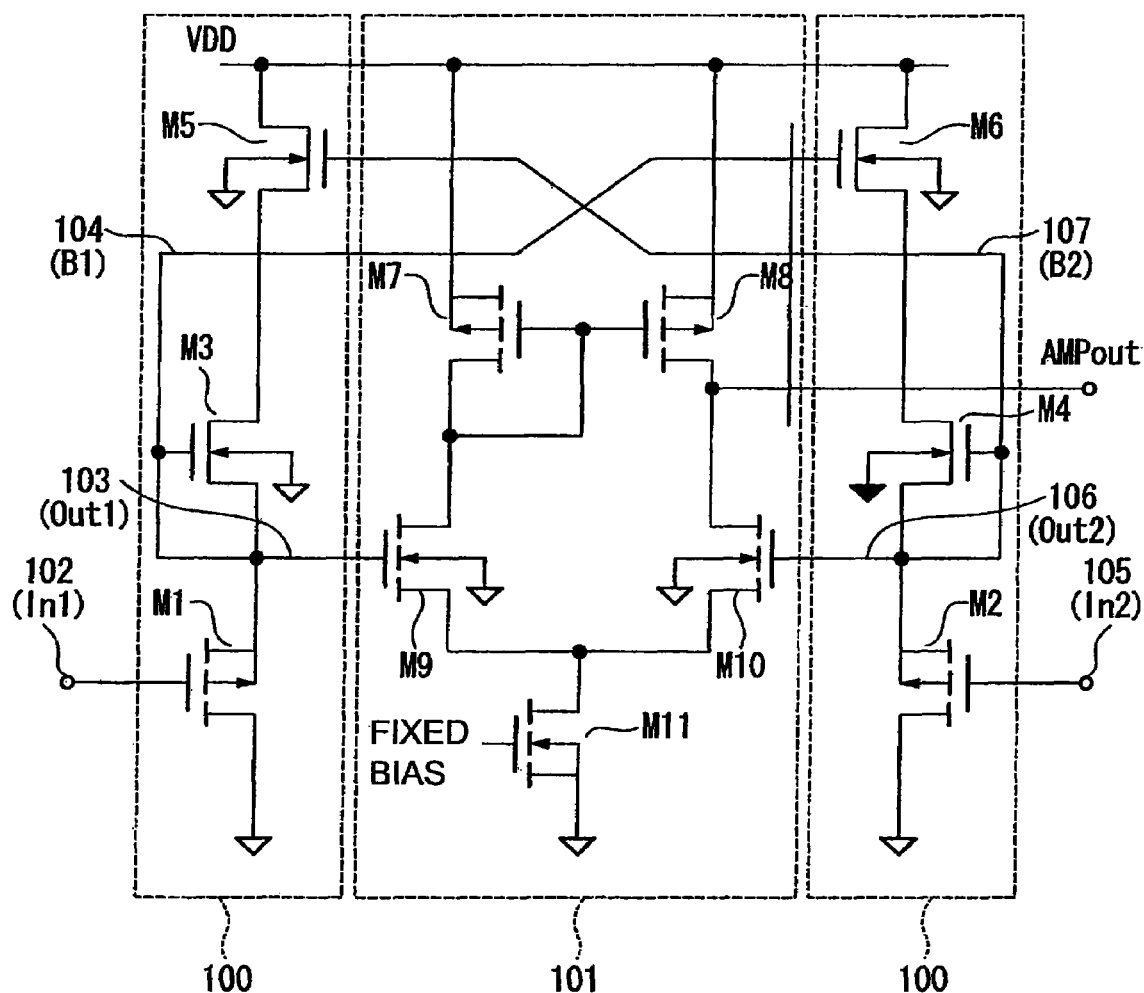
FIG. 2 illustrates a voltage level shift circuit according to a second embodiment of the present invention.

FIG. 2 illustrates a voltage level shift circuit according to a second embodiment of the present invention.

In the circuit illustrated in FIG. 2, portions surrounded by broken lines 100 operate as voltage level shift circuits, while a portion surrounded by a broken line 101 operates as a differential amplifier circuit. Further, the circuits illustrated in FIG. 2 are formed on a P-type substrate.

A P-channel enhancement type MOS transistor M1 operates as a source follower circuit with a constant current source formed of an N-channel depletion type MOS transistor M3 being a load, and functions to shift a direct current component of the input voltage to a positive power supply voltage side and to output the shifted direct current component.

Therefore, the source follower circuit formed of the transistor M1 and the transistor M3 operates as a first voltage level shift circuit for shifting the direct current component of a signal inputted from the signal input terminal (In1) 102 to the positive voltage direction and for outputting the shifted direct current component to a signal output terminal (Out1) 103.

A P-channel enhancement type MOS transistor M2 operates as a source follower circuit with a constant current source formed of an N-channel depletion type MOS transistor M4 being a load, and functions to shift a direct current component of the input voltage to a positive power supply voltage side and to output the shifted direct current component.

Therefore, the source follower circuit formed of the transistor M2 and the transistor M4 operates as a second voltage level shift circuit for shifting the direct current component of a signal inputted from the signal input terminal (In2) 105 to the positive voltage direction and for outputting the shifted direct current component to a signal output terminal (Out2) 106.

An N-channel depletion type MOS transistor M5 is serially connected to the first voltage level shift circuit. A gate terminal of the transistor M5 is connected to a gate terminal of the transistor M4 which is a bias voltage output terminal (B2) 107 of the second voltage level shift circuit.

A transistor M6 is serially connected to the second voltage level shift circuit. A gate terminal of the transistor M6 is connected to a gate terminal of the transistor M3 which is a bias voltage output terminal (B1) 104 of the first voltage level shift circuit.

The gate terminal of the transistor M5 is biased by a constant voltage which is the terminal voltage of the bias voltage output terminal (B2) 107 of the second voltage level shift circuit, and the drain current is determined by the transistor M3 which operates as a constant current source, and thus, even if a power supply voltage fluctuates, the source terminal voltage of the transistor M5 almost does not change. Therefore, the transistor M5 operates as a cascode circuit of the serially connected first voltage level shift circuit.

The gate terminal of the transistor M6 is biased by a constant voltage which is the terminal voltage of the bias voltage output terminal (B1) 104 of the first voltage level shift circuit, and the drain current is determined by the transistor M4 which operates as a constant current source, and thus, even if a power supply voltage fluctuates, the source terminal voltage of the transistor M6 almost does not change. Therefore, the transistor M6 operates as a cascode circuit of the serially connected second voltage level shift circuit.

By the action of the cascode circuits formed of the transistor M5 and the transistor M6, respectively, the influence of fluctuations in the power supply voltage on the drain-source potentials of the transistor M3 and the transistor M4 which operate as the constant current sources can be made smaller, and the change in the drain current due to channel length modulation effect of the transistors M3 and M4 can be made smaller.

Further, because the transistor M5 and the transistor M6 which operate as the cascode circuits are formed of N-channel depletion type MOS transistors, impedance of a small signal between the source terminal and the drain terminal due to parasitic capacitance can be made higher, and the power supply rejection ratio at a low frequency (<1 kHz) can be made higher.

Third Embodiment

Figure 5:
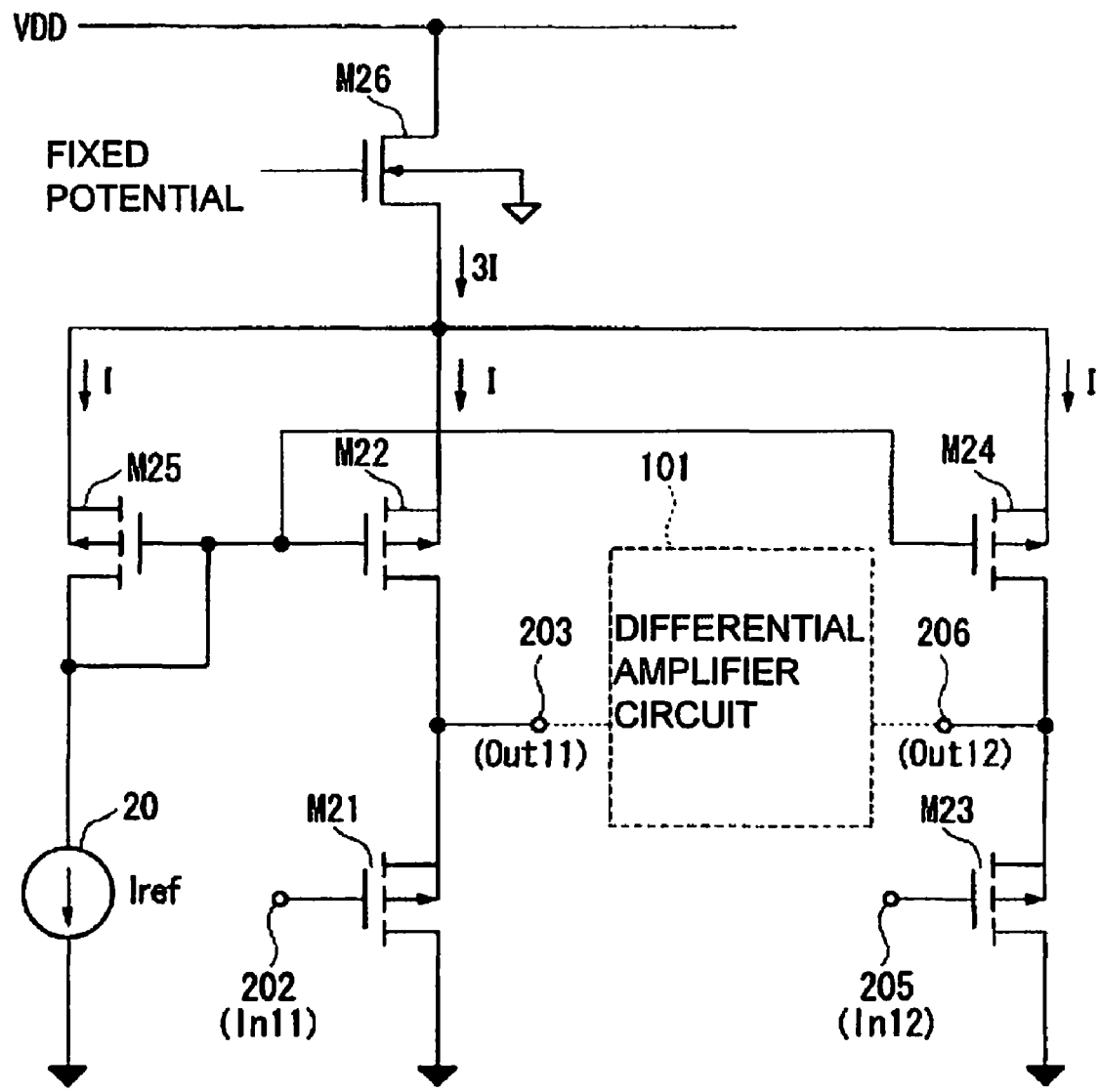
FIG. 5 illustrates a voltage level shift circuit according to a third embodiment of the present invention.
Figure 6A:
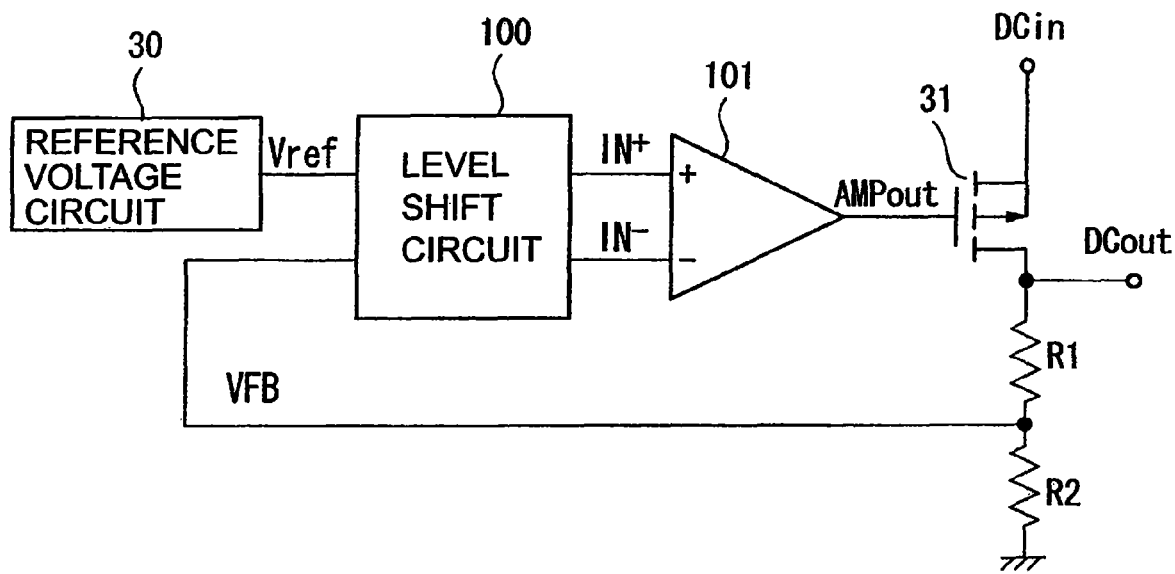
FIGS. 6A and 6B illustrate exemplary usage of the voltage level shift circuit.
Figure 6B:
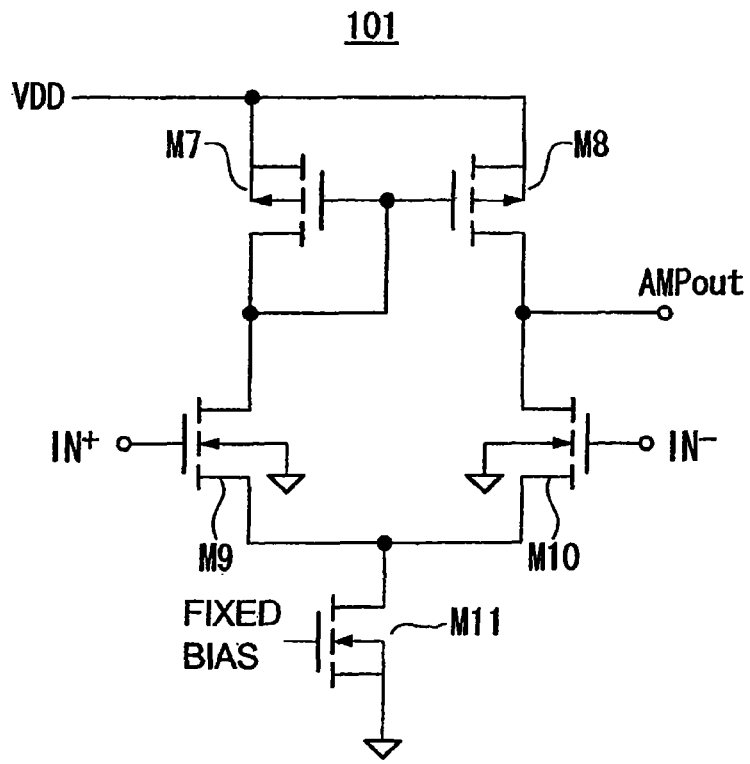
Figure 7:
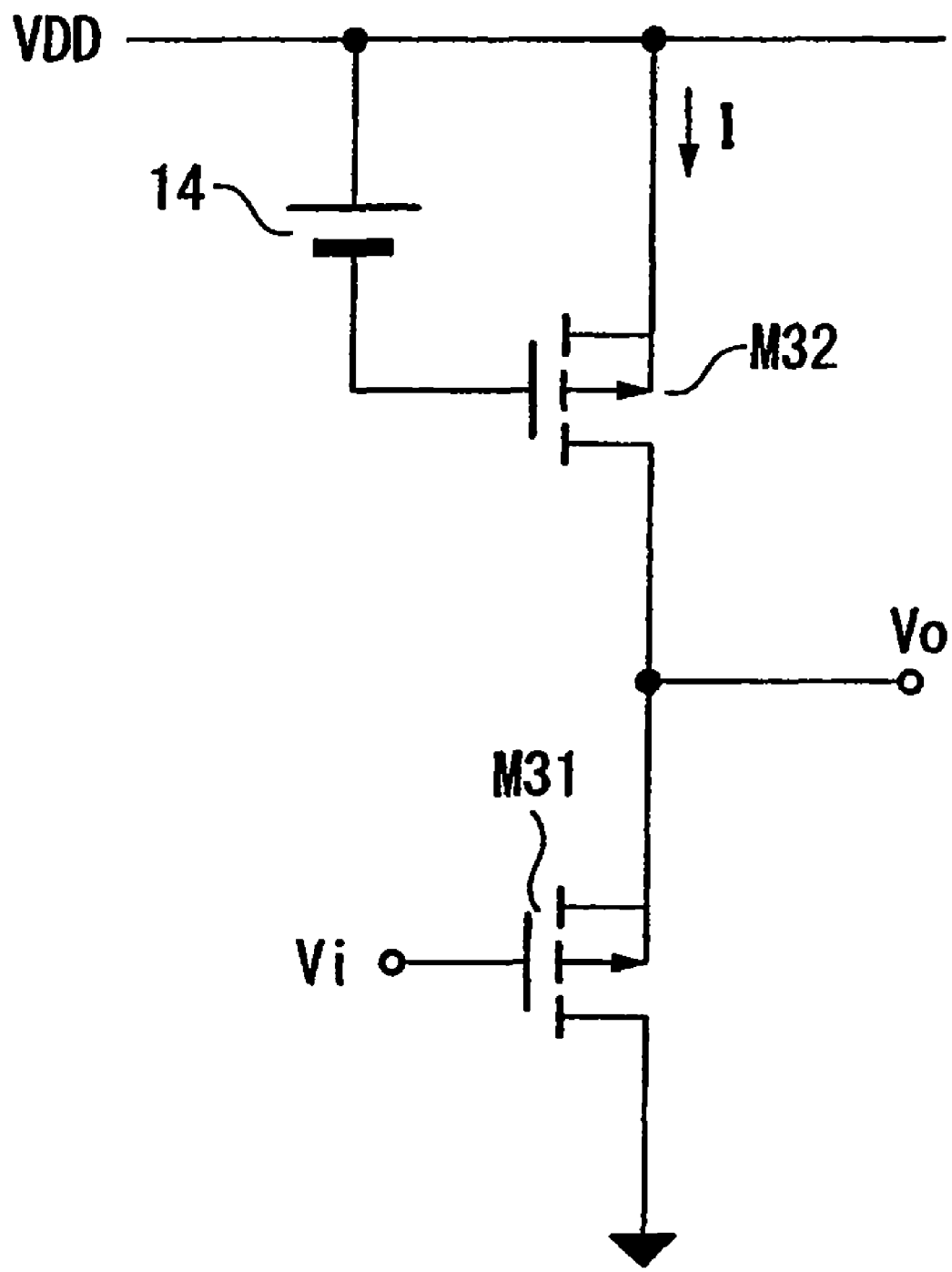
FIG. 7 illustrates an exemplary conventional source follower circuit.

FIG. 5 illustrates a voltage level shift circuit according to a third embodiment of the present invention.

In the voltage level shift circuit illustrated in FIG. 5, a P-channel enhancement type MOS transistor M21 and a P-channel enhancement type MOS transistor M22 form a first voltage level shift circuit (source follower circuit), while a P-channel enhancement type MOS transistor M23 and a P-channel enhancement type MOS transistor M24 form a second voltage level shift circuit (source follower circuit).

A constant current source 20, a P-channel enhancement type MOS transistor M25, the P-channel enhancement type MOS transistor M22, and the P-channel enhancement type MOS transistor M24 form a current mirror circuit. With this structure, when the constant current source 20 is used to feed constant current (reference current Iref) through the P-channel enhancement type MOS transistor M25, due to the current mirror effect, current I which is the same as the reference current Iref flows through the P-channel enhancement type MOS transistors M22 and M24.

A source terminal of an N-channel depletion type MOS transistor M26 is connected to source terminals of the transistors M25, M22, and M24. The transistor M26 operates as a cascode circuit of the first voltage level shift circuit formed of the transistor M21 and the transistor M22 and of the second voltage level shift circuit formed of the transistor M23 and the transistor M24. It is to be noted that current 3×I flows through the N-channel depletion type MOS transistor M26 which functions as the cascode circuit.

In this way, by the action of the cascode circuit formed of the transistor M26, the influence of fluctuations in the power supply voltage on the voltage level shift circuits (source follower circuits) can be made smaller.

Embodiments of the present invention are described in the above. The voltage level shift circuit according to the present invention are not limited thereto, and various modifications are of course possible without departing from the scope of the present invention.

According to the present invention, when a plurality of voltage level shift circuits are necessary, the same difference between the input potential and the output potential of the respective voltage level shift circuits can be maintained and the power supply rejection ratio can be improved, and therefore, the present invention is useful for a semiconductor integrated circuit including a differential amplifier circuit and the like.

What is claimed is:
1. A voltage level shift circuit, comprising:
 a first source follower circuit including:

a first P-channel enhancement type MOS transistor (M21), a gate terminal of which is connected to a first voltage signal input terminal (In11) and a drain terminal of which is grounded; and a second P-channel enhancement type MOS transistor (M22), a drain terminal of which is connected to a source terminal of the first P-channel enhancement type MOS transistor (M21) and to a first voltage signal output terminal (Out11) to be a constant current load;

a second source follower circuit including:

a third P-channel enhancement type MOS transistor (M23), a gate terminal of which is connected to a second voltage signal input terminal (In12) and a drain terminal of which is grounded; and a fourth P-channel enhancement type MOS transistor (M24), a drain terminal of which is connected to a source terminal of the third P-channel enhancement type MOS transistor (M23) and to a second voltage signal output terminal (Out12) to be a constant current load;

a cascode circuit formed of an N-channel depletion type MOS transistor (M26), a gate terminal of which is connected to a fixed potential, a source terminal of which is connected to a source terminal of the second P-channel enhancement type MOS transistor (M22) and to a source terminal of the fourth P-channel enhancement type MOS transistor (M24), and a drain terminal of which is fixed to power supply voltage; and a fifth P-channel enhancement type MOS transistor (M25) which, together with the second P-channel enhancement type MOS transistor (M22) and the fourth P-channel enhancement type MOS transistor (M24), forms a current mirror circuit, for causing a current which is the same as a reference current (Iref) to flow through the second P-channel enhancement type MOS transistor (M22) and the fourth P-channel enhancement type MOS transistor (M24).

2. A semiconductor integrated circuit, comprising the voltage level shift circuit according to claim 1.

* * * * *